United States Patent
Halter

(10) Patent No.: US 6,754,290 B1
(45) Date of Patent: Jun. 22, 2004

(54) HIGHLY PARALLEL MAP DECODER

(75) Inventor: Steven J. Halter, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 09/283,012

(22) Filed: Mar. 31, 1999

(51) Int. Cl.[7] .............................................. H04L 27/06
(52) U.S. Cl. ...................................................... 375/340
(58) Field of Search ................................ 375/340, 341, 375/262

(56) References Cited

U.S. PATENT DOCUMENTS

| | | |
|---|---|---|
| 5,544,328 A | 8/1996 | Seshadri |
| 5,721,745 A | 2/1998 | Hladik et al. |
| 6,192,503 B1 * | 2/2001 | Chennakesku et al. ..... 714/796 |
| 6,343,368 B1 * | 1/2002 | Lerzer ......................... 714/796 |

FOREIGN PATENT DOCUMENTS

WO 9820617 5/1998 .......... H03M/13/00

OTHER PUBLICATIONS

Dawid, et al., "Map Channel Decoding: Algorithm and VLSI Architecture", VLSI Signal Processing, Proceedings IEEE wol 6, No. VI, Oct. 1993, pps. 141–149.

Benedetto, et al., "Soft–Output Decoding Algorithms for Continuous Decoding of Parallel Concatenated Convolutional Codes", IEEE International conference on Communications, Jun. 1996, pps 112–117.

Hsu, et al., "A Parallel Decoding Scheme for Turbo Codes", IEEE International Symposium on Circuits and Systems, May 1998, pps. 445–448.

* cited by examiner

Primary Examiner—Khai Tran
Assistant Examiner—Kevin M Burd
(74) Attorney, Agent, or Firm—Philip P. Wadsworth; Charles D. Brown; Kevin T. Cheatham

(57) ABSTRACT

The present invention is a novel and improved technique for performing coding with particular application to turbo, or iterative, coding techniques. In accordance with one embodiment of the invention, interleaving is performed by generating the address of a memory using a PN state generator. Data is written into a memory in sequential order, and then read out using addresses specified by the PN state generator. To deinterleave, the interleaved data is written into a memory using addresses specified by the PN state generator, and then read out in sequential order. A set of PN state generators that provide excellent coding performance is provided.

13 Claims, 9 Drawing Sheets

HIGHLY PARALLEL MAP DECODER

BACKGROUND OF THE INVENTION

I. Field of the Invention

The present invention relates to coding. More particularly, the present invention relates to a novel and improved technique for performing maximum a posteriori probability (MAP) decoding.

II. Description of the Related Art

"Turbo coding" represents an important advancement in the area of forward error correction (FEC). There are many variants of turbo coding, but most use multiple encoding steps separated by interleaving steps combined with iterative decoding. This combination provides previously unavailable performance with respect to noise tolerance in a communications system. That is, turbo coding allows communications at $E_b/N_0$ levels that were previously unacceptable using the existing forward error correction techniques.

Many systems use forward error correction techniques, and therefore would benefit from the use of turbo coding. For example, turbo codes could improve the performance of wireless satellite links where the limited downlink transmit power of the satellite necessitates receiver systems that can operate at low $E_b/N_0$ levels. Using turbo codes in a wireless satellite link could reduce the dish size for a digital video broadcast (DVB) system, or alternatively, allow more data to be transmitted.

Digital wireless telecommunication systems such as digital cellular and PCS telephone systems also use forward error correction. For example, the IS-95 over-the-air interface standard, and its derivatives, such as IS-95B, define a digital wireless communications system that uses convolutional encoding to provide coding gain to increase the capacity of the system. A system and method for processing RF signals substantially in accordance with the use of the IS-95 standard is described in U.S. Pat. No. 5,103,459 entitled "System and Method for Generating Signal Waveforms in a CDMA Cellular Telephone System" assigned to the assignee of the present invention and incorporated herein by reference ('459 patent).

Many types of turbo coding require more complex circuitry than the previous available FEC coding techniques. For example, many turbo codes use maximum a posteriori probability (MAP) decoders, which are more complex than conventional Viterbi trellis decoders. For high data rate applications, the more complex MAP decoder can reduce the data rate at which data transmission can be performed. Thus, it would be highly desirable to have a MAP decoder that could operate at high data rates.

SUMMARY OF THE INVENTION

The present invention is a novel and improved technique for performing maximum a posteriori probability (MAP) decoding, with particular application to turbo, or iterative, coding techniques. In accordance with one embodiment of the invention, a set MAP decoders are applied in parallel to different sections of a frame symbol estimates to be decoded. Each MAP decoder generates decisions for the section of symbol estimates received. In one embodiment, initialization values are generated. The MAP decoders use the initialization values to start decoding at each section where the section begin at the middle of the frame.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is a novel and improved technique for performing turbo coding. The exemplary embodiment is described in the context of the digital cellular telephone system. While use within this context is advantageous, different embodiments of the invention may be incorporated in different environments, configurations or digital data transmission systems, including satellite communication systems and wire line communication system such as digital cable and telephone systems.

In general, the various systems described herein may be formed using software controlled processors, integrated circuits, or discrete logic, however, implementation in an integrated circuit is preferred. The data, instructions, commands, information, signals, symbols and chips that may be referenced throughout the application are advantageously represented by voltages, currents, electromagnetic waves, magnetic fields or particles, optical fields or particles, or a combination thereof. In addition, the blocks shown in each block diagram may represent either hardware or method steps.

Figure 1A:
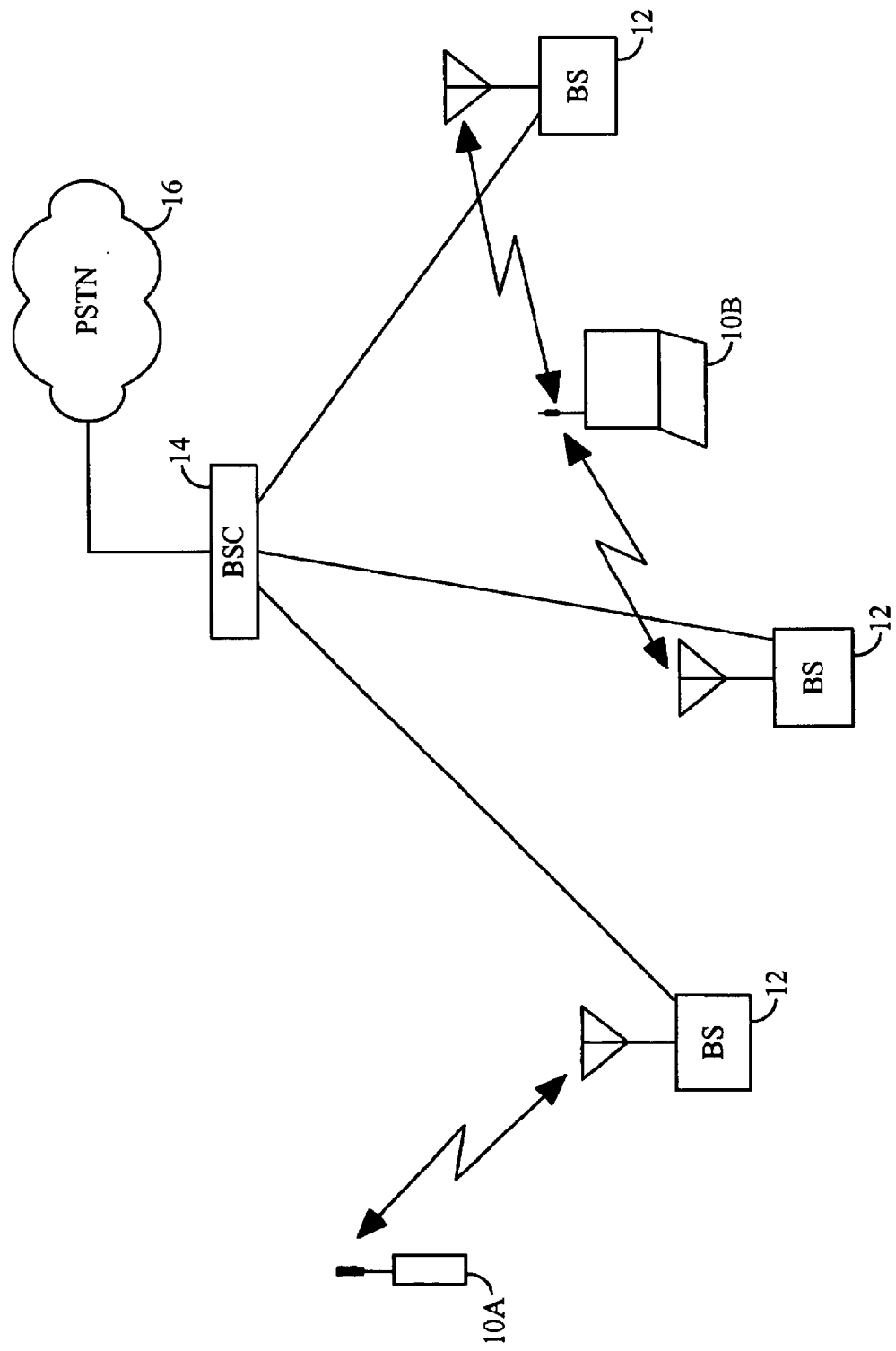
FIG. 1A is a highly simplified diagram of a cellular telephone system configured in accordance with one embodiment of the invention.

FIG. 1A is a highly simplified diagram of a cellular telephone system configured in accordance with one embodiment of the invention. To conduct telephone calls or other communications, subscriber units 10A interface with base stations 12 via RF signals. Base stations 12 interface with the public switch telephone network via base station controller (BSC) 14.

Figure 1B:
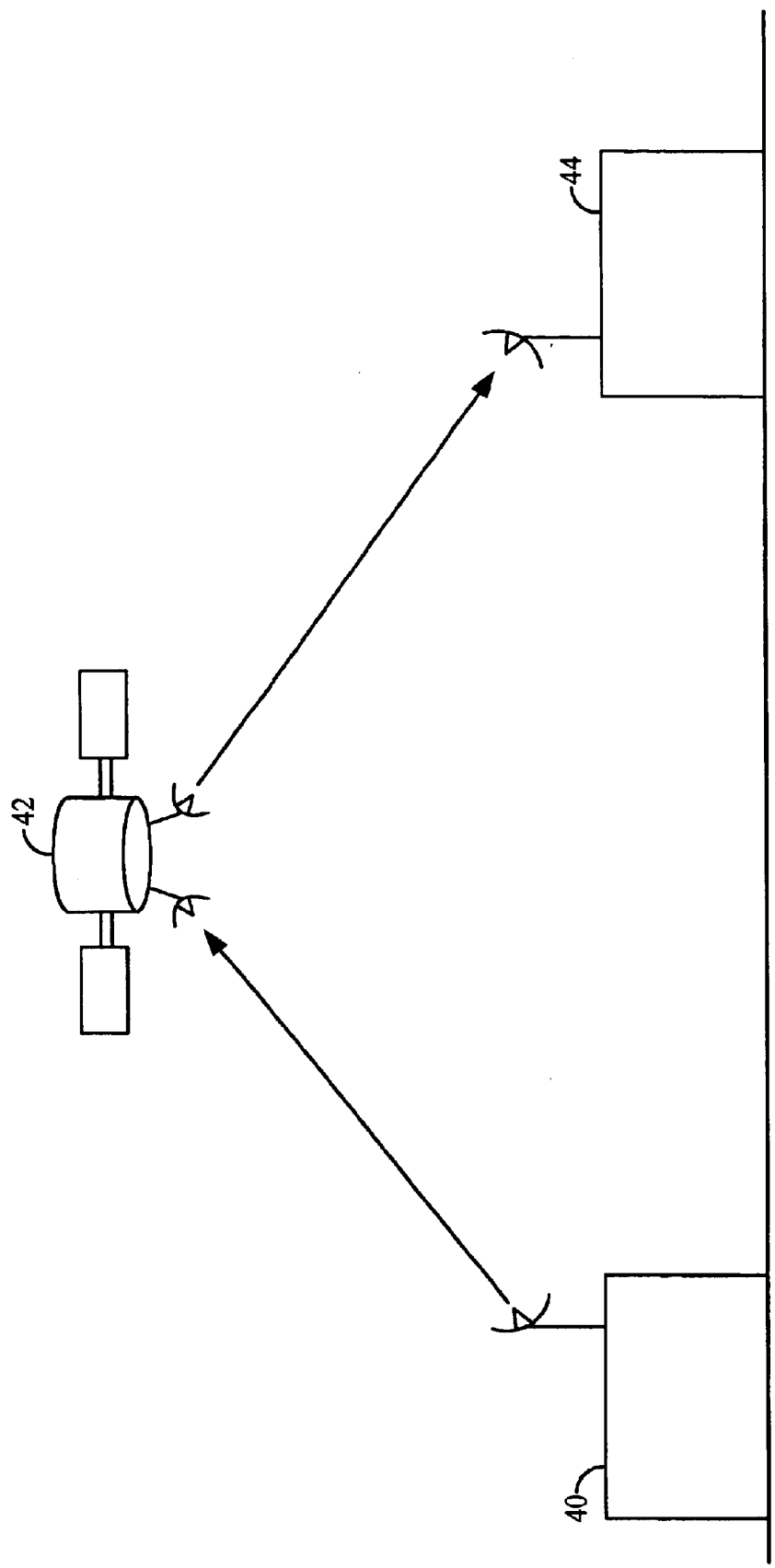
FIG. 1B is a highly simplified diagram of a satellite communications system configured in accordance with one embodiment of the invention.

FIG. 1B is a highly simplified diagram of a satellite communications system configured in accordance with another embodiment of the invention. Uplink station 40 transmits RF signals containing information such as video programming to satellite 42. Satellite 42 relays the RF signals back to earth where receiver 44 converts the receive RF signals into digital data.

Figure 2:
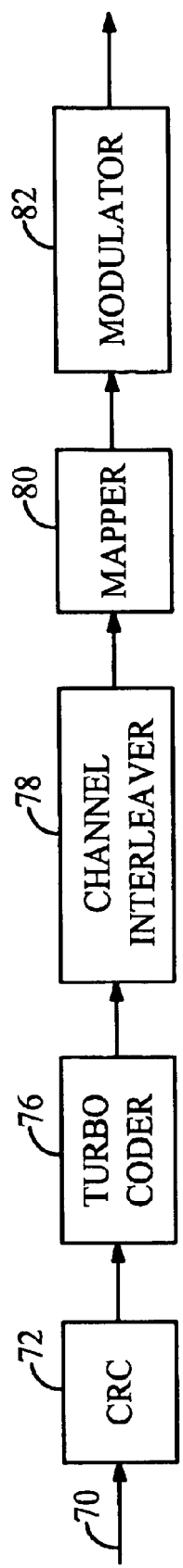
FIG. 2 is a block diagram of an interleaver when configured in accordance with one embodiment of the invention.

FIG. 2 is a block diagram of an exemplary transmit system configured in accordance with the use of one embodiment present invention. The transmit system can be used within a subscriber unit 10, a base stations 12, or uplink station 40, as well as any other system that generates digital signals for transmission. The transmit processing shown represent just one possible embodiment of the invention, as numerous other transmit processing schemes may incorporate and benefit from the use of various embodiments of the invention. Data 70 is supplied to CRC generator 72 which generates CRC checksum data for a given each predetermined amount of data received.

The resulting data blocks are supplied to turbo coder 76 which generates code symbols that are supplied to channel interleaver 78. The code symbols typically include a retransmission of the original data (the systematic symbol), and one or more parity symbols. The number of parity symbols transmitted for each systematic symbol depends on the coding rate. For a coding rate of ½ one parity symbol is transmitted for every systematic symbol, for a total of two symbols generated for each data bit (including CRC) received. For a rate ⅓ turbo coder, two parity symbols are generated for each systemic symbol, for a total of three symbols generated for each data bit received.

The code symbols from the turbo coder 76 are supplied to channel interleaver 78. Channel interleaver 78 performs interleaving on blocks the symbols as they are received, outputing interleaved symbols that are received by mapper 80. Typically, channel interleaver 78 performs block or bit-reversal interleaving, virtually all other types of interleavers many be used as the channel interleaver.

Mapper 80 takes the interleaved code symbols and generates symbol words of certain bit width based on a predetermined mapping scheme. The symbol words are then applied to modulator 82 which generates a modulated wave form based on the symbol word received. Typical modulation techniques include QPSK, 8-PSK, and 16 QAM, although various other modulation schemes may be utilized. The modulated waveform is then upconverted for transmission at an RF frequency.

Figure 3A:
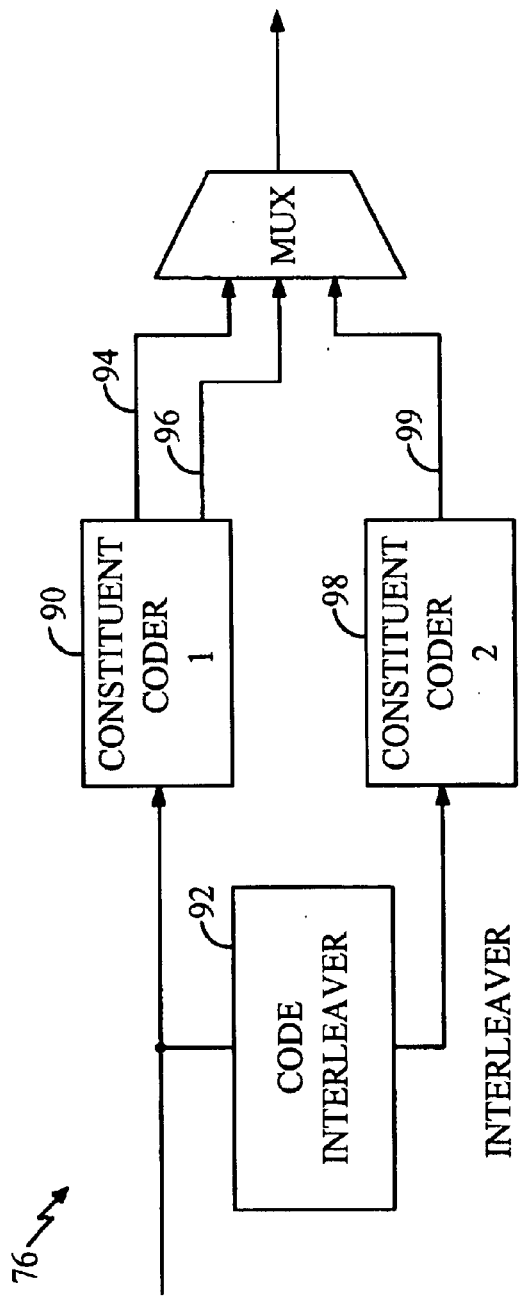
FIG. 3A is a block diagram of a turbo coder in accordance with one embodiment of the invention.

FIG. 3A is a block diagram of a turbo coder configured in accordance with a first embodiment of the invention. In this first embodiment of the invention, the turbo coder is configured as a parallel concatenated turbo coder. Within the version of the turbo coder 76, constituent coder 90 and code interleaver 92 receive the data frorn CRC generator 72, which as described above output the input data and CRC checksum bits. As is well known, code interleaver 92 should be a highly randomized interleaver for the best performance. An interleaver that provides excellent performance with minimal complexity as a code interleaver is described in copending An interleaver that provides excellent performance with minimal complexity as a code interleaver is described in copending U.S. patent application Ser. No. 09/158,459 filed Sep. 22, 1998 entitled "Coding System Having State Machine Based Interleaver", and co-pending Continuation-In-Part application Ser. No. 09/172,069, filed Oct. 13, 1998 entitled "Coding System Having State Machine Based Interleaver", and U.S. Pat. No. 6,304,991 filed Dec. 4, 1998 entitled "Turbo Code Interleaver Using Linear Cogruential Sequence". Constituent coder 90 outputs systematic symbols 94 (typically a copy of the original input bits) and parity symbols 96. Constituent coder 98 receives the interleaved output of code interleaver 92 and outputs a second set of parity symbols 99. Other interleavers are known such at the interleaver described in the Cdma2000 common air interface standard.

The outputs of constituent coder 90 and constituent coder 98 are muxed into the output data stream for a total coding rate R of ⅓. Additional constituent codes and code interleaver pairs may be added to reduce the coding rate for increased forward error correction. Alternatively, some of the parity symbols 96 and 99 may be punctured (not transmitted) to increase the coding rate. For example, the coding rate could be increased to ½ by puncturing every other parity symbol 96 and 99, not transmitting parity symbol 96 at all.

Constituent coders 90 and 98 may be various types of coders including block coders or convolutional coders. As convolutional coders, constituent coders 90 and 98 typically have a small constraint length such as 4 (four) to reduce complexity, and are recursive systematic convolutional (RSC) encoders. The lower constraint length reduces the complexity of the corresponding decoder at the receive system. Typically, the two coders output one systematic symbol and one parity symbol for each bit received for a constituent coding rate R=½. The total coding rate for the turbo coder of FIG. 1A is R=⅓, however, because the systematic bit from constituent coder 98 is not used. As noted above, additional interleaver and coder pairs may also be added in parallel to reduce the coding rate, and therefore provide higher error correction, or puncturing can be performed to increase the coding rate.

Figure 3B:
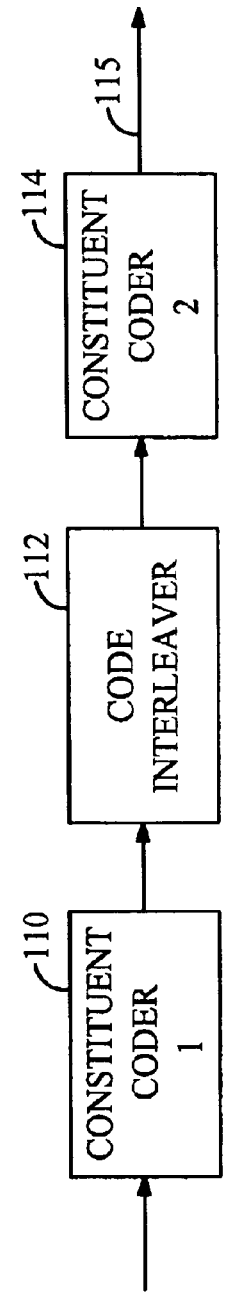
FIG. 3B is a turbo coder in accordance with another embodiment of the invention.

FIG. 3B depicts turbo coder 109 as a serial concatenated turbo coder in accordance with an alternative embodiment of the invention. Within the turbo coder of FIG. 3B, the data from tail bit generator 74 is received by constituent coder 110 and the resulting code symbols are applied to code interleaver 112. The resulting interleaved parity symbols are supplied to coder 114, which performs additional encoding to generate parity symbols 115. Typically, constituent coder 110 (the outer coder) may be various types of encoders including block encoders or convolutional encoders, but constituent coder 114 (the inner coder) is preferably a recursive code and is typically a recursive systematic encoder.

As recursive systematic convolutional (RSC) encoders, constituent coders 110 and 114 generate symbols at a coding rate R<1. That is, for a given number of input bits N, M output symbols are generated where M>N. The total coding rate for the serial concatenated turbo coder 109 of FIG. 3B is the coding rate of constituent coder 110 multiplied by the coding rate of constituent coder 114. Additional interleaver and coder pairs may also be added in series to reduce the coding rate and therefore provide additional error protection.

Figure 4:
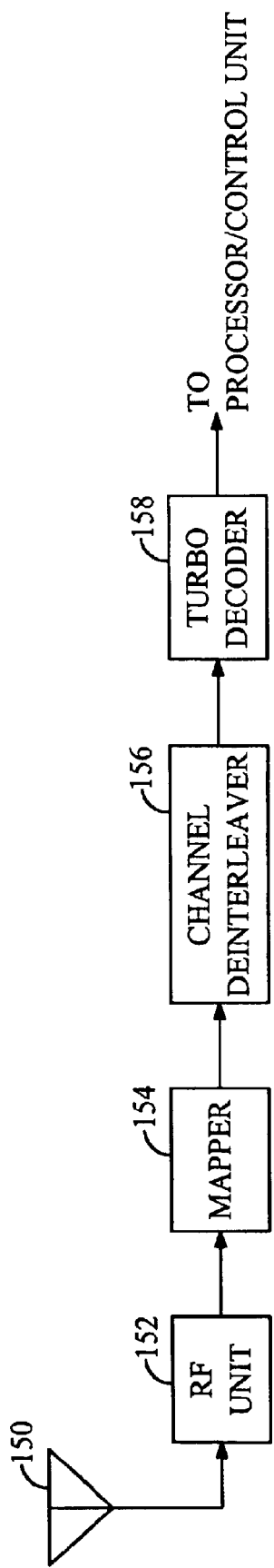
FIG. 4 is a block diagram of a receive system in accordance with one embodiment of the invention.

FIG. 4 is a block diadem of a receive system configured in accordance with one embodiment of the invention. Antenna 150 provides the received RF signals to RF unit 152. RF unit performs downconversion, filtering, and digitization of the RF signals. Mapper 154 receives the digitized data and provides soft decision data to channel deinterleaver 156. Turbo decoder 158 decodes the soft decision data from channel deinterleaver 156 and supplies the resulting hard decision data to the processor or control unit at the receive system, which can check the accuracy of the data using the CRC checksum data.

Figure 5:
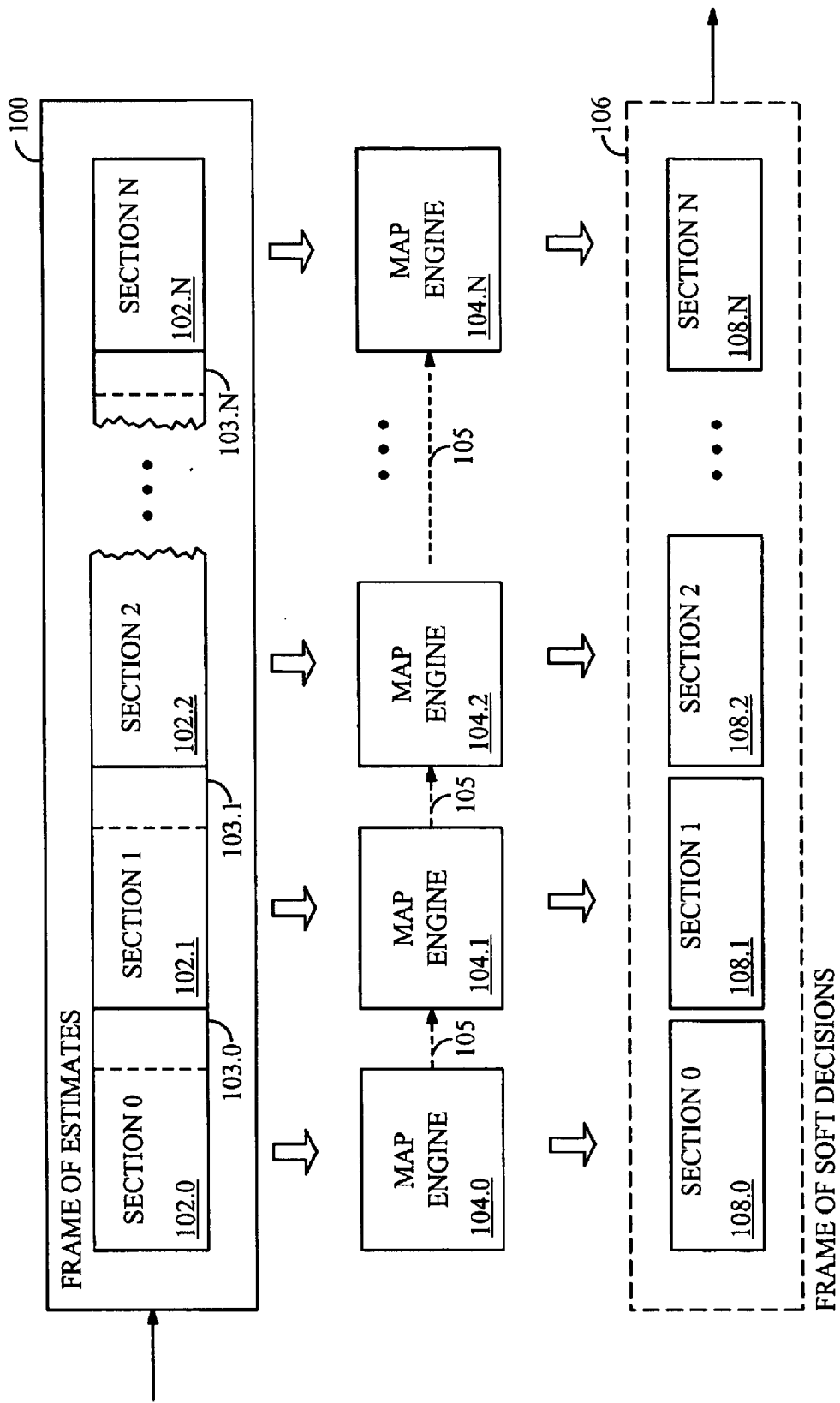
FIG. 5 is a block diagram of the processing of a frame of receive estimates in accordance with one embodiment of the invention.

FIG. 5 is a block diagram of the processing of a frame of receive estimates in accordance with one embodiment of the invention. The frame 100 of estimates are divided into N sections (portions) 102.0–102.N. Each section is provided to a MAP decoder engine 104.0B–104.N. Each MAP engine performs MAP decoding over the section of receive estimates received. The resulting sections 108 of soft (or hard) decisions are output to make decision frame 106.

In accordance with one embodiment of the invention, MAP engines 104.0–104.N–1 processes a tail portion 103 of the section they receive, generating an initialization value 105 that is forwarded to the MAP engine 104 processing the next section in the frame. The processing preferably comprises generating a set of forward state metrics over the last window 103. This processing results in a state metric that can be used as the initialization state of the forward state metric of the MAP engine 104 receiving the state metric value.

Last window 103 is preferably long enough to allow the state metric to arrive at a reliable state, which is typically at least three (3) times the memory length (K) of the RSC coder used in the encoder and preferably at least eight (8) times the memory length. In an alternative embodiment of the invention, the tail portion 103 may be supplied directly to the next MAP engine 104, as well as the corresponding MAP engine. That is, tail portion 103 from section 102.X may be supplied to MAP engine 104.X+1, as well as MAP engine 104.X. Each MAP engine 104 may then calculate its own initialization value.

In the described embodiment, the MAP engines operate by first calculating forward state metrics and then calculating reverse state metrics. It is well known in the art that the reverse state metrics could be calculated first, and the then the forward state metrics would be calculated. In general, throughout the application the swapping of the reverse state metric calculators and the forward state metric calculators is consistent with the use of the invention. In the scheme of FIG. 4, if reverse state metric calculation was performed first, the tail portion 103 would be the first set of symbol estimates for each section, rather than the last, and each MAP engine 104.X would supply an initialization value to MAP engine 104.X–1, as should be apparent to those skilled in the art.

By breaking up the frame into sections, and processing each section using a MAP engine, the rate at which frame can be processed is increased. Thus, higher data rate communications can receive the benefit of the greater Eb/N0 performance of turbo coding.

Figure 6:
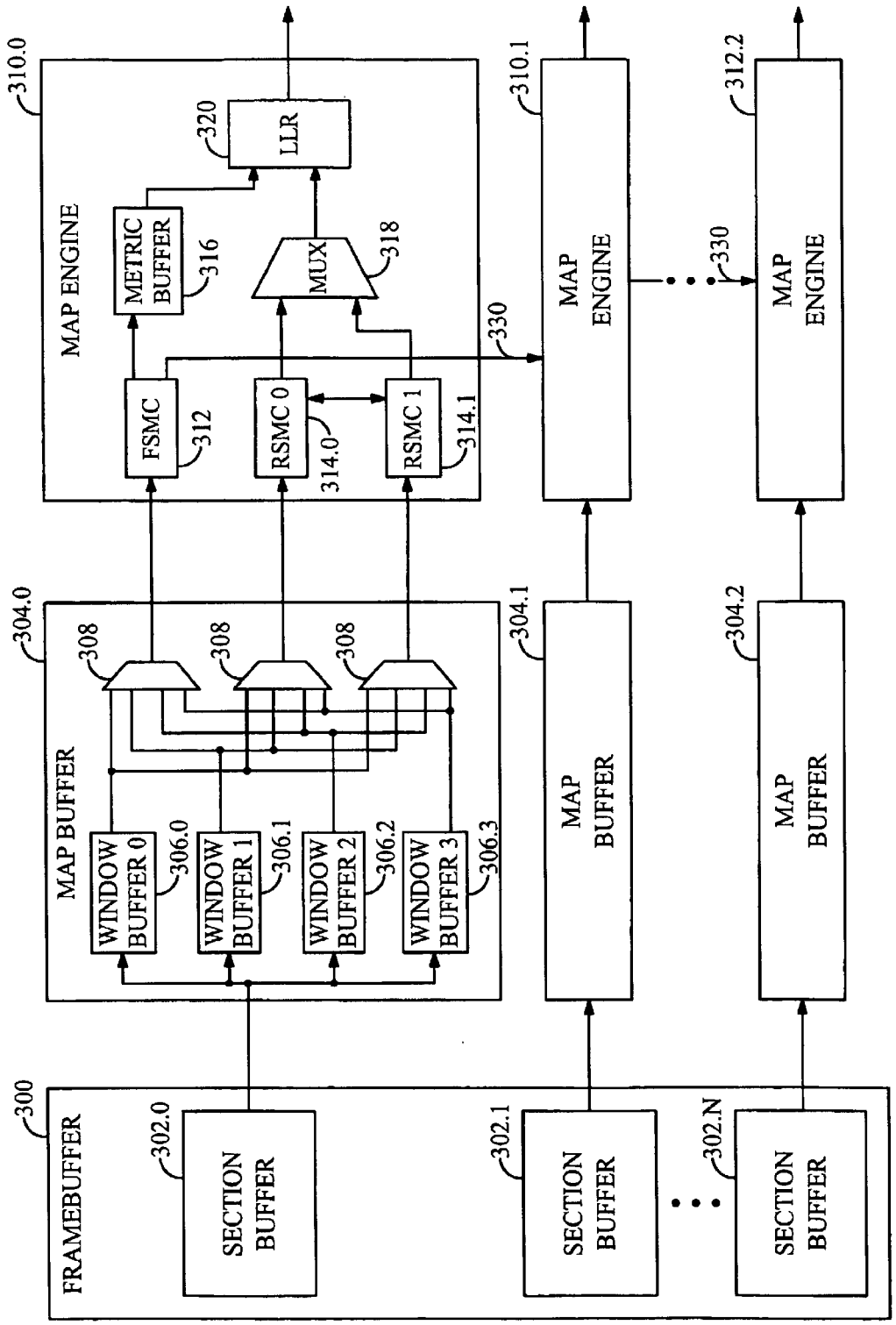
FIG. 6 is a block diagram of a MAP decoder in accordance with one embodiment of the invention.

FIG. 6 is a block diagram of a MAP decoder configured in accordance with one embodiment of the invention. Frame buffer 300 stores a frame of symbol estimates. Within frame buffer 300, section buffers 302.0–302N store different sections of the frame. The sections are preferably completely different from one another to maximize efficiency, however, some overlap in the symbols estimates stored may also be employed. Each section buffer may be read from in substantially simultaneous fashion.

MAP buffers 304.1–304.N receive symbol estimates from corresponding section buffers 304. Within MAP buffers 304 (as shown in detail by MAP buffer 304.1) window buffers 306.0–306.3 receive one window of symbol estimates from section buffer 302. A window is an amount of symbol estimates that is substantially less than that stored in a section buffer 302. A window is preferably at least four times the memory length (K) of the RSC encoding scheme used to perform encoding, and is typically about eight times the memory length.

During operation, three of the four window buffers 306 read out symbol estimates to MAP engine 310 via multiplexers 308. The fourth window buffer 306 has symbol estimates written in from section buffer 302. Within MAP engine 310, the forward state metric calculator (FSMC) 312 generates forward state metrics over a window of symbol estimates which are stored in metric buffer 316. Additionally, reverse state metric calculators (RSMC) generate reverse state metrics for other windows of symbol estimates.

Preferably, the FSMC 412 and the RSMC 414 operate over windows of symbol estimates, so that metric buffer 416 only needs to store a windows worth of forward state metrics. This is contrast to other MAP decoding systems, which process the entire frame of symbol estimates in one direction (typically forward) before starting to process the entire frame in the next direction (typically reverse). Processing the entire section in this manner requires huge amounts of memory to store all the state metrics for the section, and therefore is not preferred. However, the use of MAP engines that processes the entire section one direction before processing the section in the next direction is consistent with alternative embodiments of the invention.

Multiplexer 318 applies one set of reverse state metrics to log likelihood ratio calculator (LLR) 320 which calculates the log likelihood ratio of the forward and reverse state metrics to generate extrinsic information. The extrinsic information can be used to perform another iteration of decoding in accordance with the iterative decoding techniques of turbo coding. The other reverse state metric calculator generates an initialization state for use during the decoding of the next window of symbol estimates.

Additionally, in accordance with one embodiment of the invention, FSMC 312 processes the end portion (last window) of the section it is processing (i.e. the set of symbols stored in the corresponding section buffer 302). This last window processing generates an initialization state 330 that is passed to the next MAP engine 312 for processing the next section of symbol estimates in the frame. For example, MAP engine 310.0 would pass the initialization state 330 to MAP engine 310.1. Typically, the first MAP engine 310.0 does not need an initialization state because the state of the coding at the start of the frame is known. Additionally, the state of the encoder at the end of the frame is preferably known, via the use of tail bits added to the frame during transmit processing, which is well known in the art. In an alternative embodiment of the invention, a MAP engine 310 will initialize itself by processing the last window of the previous section in the frame. It should be noted that the window used for initialization (last window) and the windows used during the processing of the section do not have to be the same length.

A similar system and method for operating MAP buffer 304 in conjunction with a MAP engine 310 is described in copending U.S. patent application Ser. No. 09/283,013 entitled "MEMORY ARCHITECTURE FOR MAP DECODER" filed on Mar. 31, 1999, assigned to the assignee of the present invention and incorporated herein by reference. Additionally, a system and method for implementing a sliding window MAP engine in copending U.S. patent application Ser. No 08/743,689 entitled "Soft Decision Output Decoder for Decoding Convolutionally Encoded Codewords" assigned to the assignee of the present invention and incorporated herein by reference.

Figure 7:
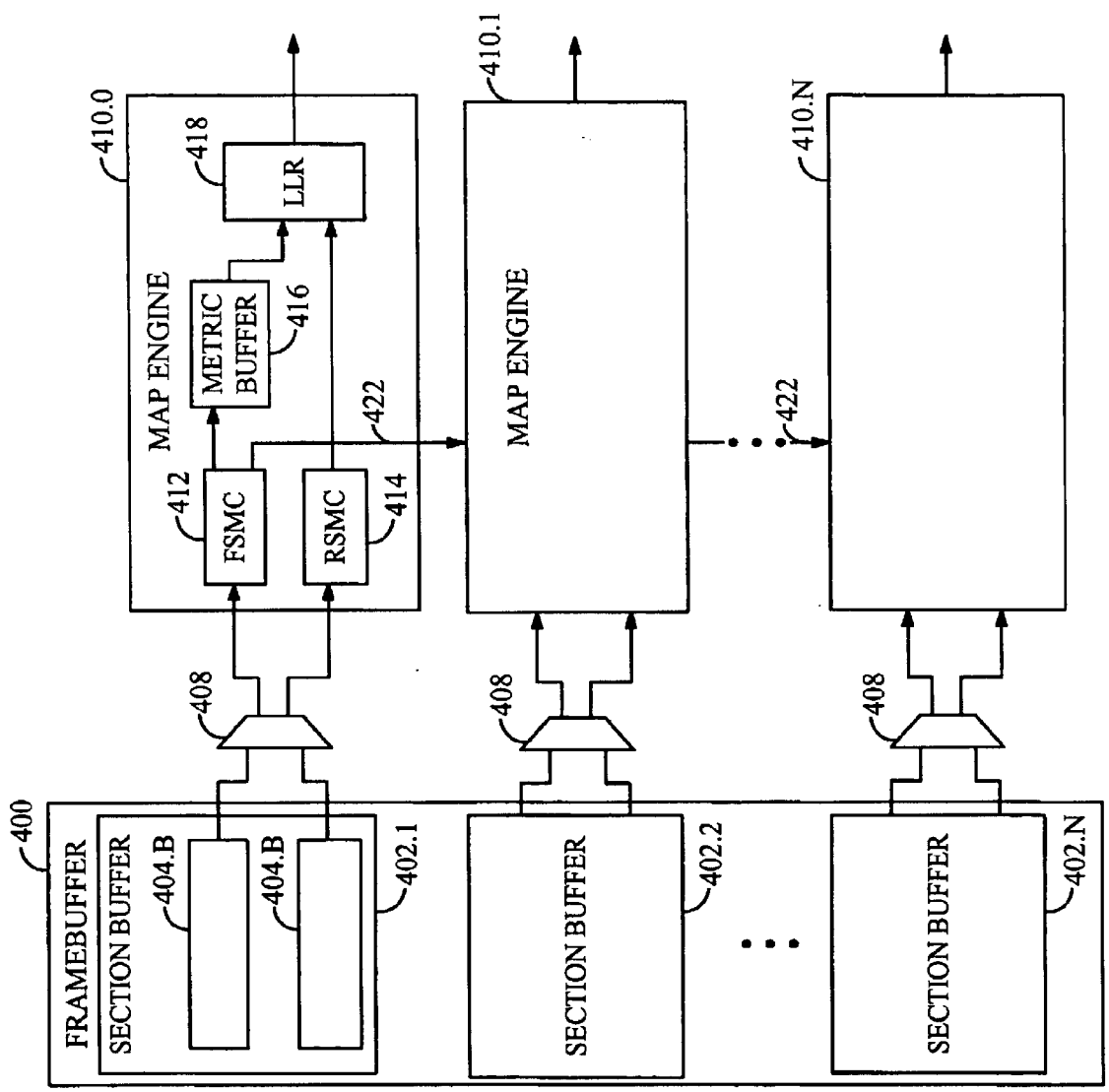
FIG. 7 is a block diagram of a highly simplified MAP decoder in accordance with another embodiment of the invention.

FIG. 7 is a block diagram of a highly simplified MAP decoder configured in accordance with a second embodiment of the invention. The embodiment of FIG. 7, does not provide the same performance as that of FIG. 6, but significant improvement in the data rate processing ability is still provided. Frame buffer 400 holds a frame of symbol estimates. Frame buffer 400 is comprised of a set of section buffers 402, which in turn are comprised of section banks 404.A and 404.B. MAP engines 410 receive symbol estimates from corresponding section buffers 402 via multiplexers 408. MAP engine 410.0 is shown in detail.

Within a MAP engine 410.0, forward state metric calculator (FSMC) 412 generates forward state metrics in response to symbol estimates received from section buffer 402. The forward state metrics are stored in metric buffer 416. Reverse state metric calculator (RSMC) 413 generates reverse state metrics which are applied to log-likelihood ratio calculator (LLR) 418. LLR 418 performs a log-likelihood ratio calculation on the forward and reverse state metrics and outputs soft decision data (typically extrinsic data) that can be used to conduct another decoding iteration or to generate hard decisions. The other MAP engines 410 and section buffers 402 operate in a similar manner, at substantially the same time, with one notable exception being that the last MAP engine 410.N does not generate an initialization state (value) for the next MAP engine.

Preferably, the FSMC 412 and the RSMC 414 operate over windows of symbol estimates, so that metric buffer 416 only needs to store a windows worth of forward state metrics (or two windows for a double buffered memory). Additionally, it is preferable to have FSMC 412 and RSMC 414 operate at the same time when possible to further reduce processing time. In an exemplary processing, FSMC 412 processes a first window (L) of symbol estimates while RSMC 414 simultaneously processes the next (sequential) window of symbol estimates (2L). Once FSMC 412 completes processing widow L, RSMC 414 begins processing window L using the starting state generated during the processing window 2L, with the results going to LLR 418 as described above. This processing continues for the set of windows 1 . . . M making up the frame, with FSMC 412 processing window j*L and RSMC 414 processing windows (j+1)L and j*L. Additionally, in one embodiment of the invention, FSMC 412 first processes a set of estimates at the end of the section of symbol estimates (for example the last window M*L of symbol estimates) to generate an initialization state 422. The initialization state 422 is passed to the next MAP engine 410.1. MAP engine 410.1 also generates an initialization state 422, and then start FSMC processing using the initialization state received from MAP engine 410.0.

In the embodiment of the invention shown in FIG. 7, section buffers 402 are divided into two banks 404 that may be written or read from simultaneously. This allows simultaneous processing by FSMC 412 and RSMC 414 which increases efficiency. A system and method for performing MAP decoding that uses a partitioned frame buffer is described in copending U.S. patent application Ser. No. 09/259,665 entitled "PARTITIONED INTERLEAVER MEMORY FOR MAP DECODER" filed on Feb. 26, 1999 assigned to the assignee of the present invention and incorporated herein by reference. The system described in this patent partitions the memory into three banks, however, the same principles of operation are applicable. In one embodiment of the invention shown in FIG. 7, every even (2L, 4L, 2*jL) window of symbol estimates is stored in one bank 404 and every odd window (1L, 3L . . . 2(j+1)L) of symbol estimates is stored in the other bank 404. Storing in this fashion allows FSMC 412 and RSMC 414 to access different portions of the section simultaneously. Other distributions of the symbol estimates within the two banks 404 that allow simultaneous access to by FSMC 412 and RSMC 414 should be apparent and are consistent with the use of the present invention.

In an alternative embodiment of the invention, a MAP buffer similar to that shown in FIG. 6 may be employed in the system of FIG. 7. In this configuration, section buffer 402 is comprised of a single bank, rather than partitioned. Also, the number of window RAMs in the MAP buffer would be three, rather than the four shown in FIG. 6, because one less state metric calculator is used.

Conversely, the partitioned memory of FIG. 7, where the section buffers are divided, could also be employed in the embodiment of FIG. 6. For example, MAP buffers 304 could be removed, and section buffers 302 (FIG. 6) partitioned into three banks for simultaneous access by FSMC 312 and RSMCs 314.0 and 312.1. In this embodiment, the operation of the section buffer 402 would be similar to the frame buffer described in copending U.S. patent application Ser. No. 09/259,665 entitled "PARTITIONED INTERLEAVER MEMORY FOR MAP DECODER".

In a still more simplified embodiment of the invention, a single state metric calculator, capable of generating both forward and reverse state metrics could be used in each MAP engine. Once again, this reduces the rate at which data can be processed relative the other embodiments, but still provides highly parallel operation when combined with the use of multiple MAP engines working on different sections of a frame.

While the use of a sliding window MAP engine as described in the various embodiments is preferred, because it reduces the size of any metric buffers such as metric buffers 416 or 316, they are not necessary. For example, a set of MAP engines that decode entire sections of symbol in one direction before starting to decode the section in the other direction are consistent with the use of some aspects of the invention.

In a typical transmit system, the frame buffers 200 and 400 are used as channel deinterleaver memory as well, with the deinterleaving being done by writing data in, or reading data out, using the interleaved address sequence. Additionally, in other embodiments each section buffer may contain overlapping portions (sections) of the frame. These overlapping sections allow each MAP engine to initialize themselves, and therefore removes the need to transfer initialization states between MAP engines.

In still other embodiments, each MAP engine may process each section without the use of initialization states. This embodiment has reduced complexity, but the coding accuracy is severely reduced.

Figure 8:
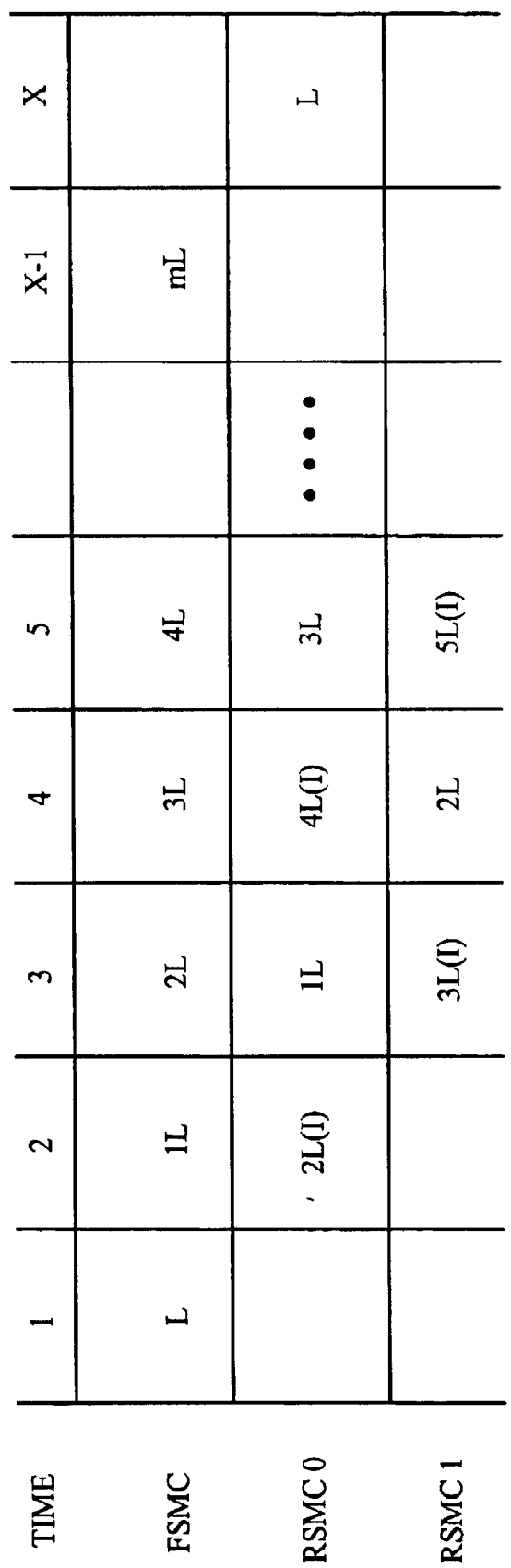
FIG. 8 is a timing diagram illustrating the processing performed by a MAP engine during the decoding of a section of a frame in accordance with one embodiment of the invention.

FIG. 8 is a timing diagram illustrating the processing performed by a MAP engine during the decoding of a section of a frame when performed in accordance with one embodiment of the invention. The timing diagram is described with reference to the structures of FIG. 6 for convenience, but various other implementation my use the exemplary timing provided.

During a first time slot (1), the MAP engine 310 processes the Mth (last) window of symbol estimates using the FSMC 312. The state of FSMC 312 is then forwarded to the next MAP engine 310 as the initialization state 330.

During the next time slot (2), FSMC 312 processing the first window of symbol estimates (1L) and the RSMC 314.0 processing the second window of symbol estimates (2L). During the third time slot (3), RSMC 314.1 processes the third (3L) window of symbol estimates, and RSMC 314.0 processing the first window (1L) of symbol estimates being properly initialized by the processing of the second window of symbol estimates during the second time slot, with the initialization being indicated by the (I). The processing continues until the forward state metrics and reverse state metrics are generated for each window in the section of the frame. As noted above, each MAP engine performs this type of processing on each section, allowing the frame to be processed in its entirety in an extremely rapid, highly parallel, fashion.

Thus, a novel and improved technique for performing highly parallel MAP decoding has been described. The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A system for performing MAP decoding comprising:

a radio frequency (RF) unit for receiving a RF signal and converting the RF signal to a digital signal;

a mapper for receiving the digital signal and for providing a soft decision data based on the digital signal; and a turbo decoder for receiving the soft decision data and providing a hard decision data, wherein the turbo decoder includes a MAP decoder comprising:

a set of MAP engines, each for decoding a corresponding different portion of a frame of symbol estimates where each portion is formed by dividing the frame of symbol estimates and each portion is substantially different from another portion;

a set of memory elements for dividing the frame of symbol estimates into the different portions, each of the memory elements simultaneously providing at least one of said different portions to a corresponding MAP engine, wherein each of the MAP engines generates an initialization state by decoding a last portion of the divided frame of symbol estimates from the memory elements and provides the initialization state to an adjacent map engine, and the adjacent map engine initializes using the received initialization state.

2. The system as set forth in claim 1 wherein said frame of symbol estimates has a known starting state and a known ending state.

3. The system as set forth in claim 1 wherein some of said set of MAP engines generate initialization values from said substantially different portion of said set of symbol estimates.

4. The system as set forth in claim 3 wherein each of said some of said set of MAP engines provide said initialization data to another MAP engine.

5. The system as set forth in claim 1 wherein some of said set of MAP engines generate initialization values from portion of said set of symbol estimates that is not said corresponding portion of said symbol estimates.

6. A MAP decoder comprising:

a frame buffer including a plurality of section buffers for storing a frame of symbol estimates, each of the section buffers storing a different section of the frame of symbol estimates, where each of the sections is formed by dividing the frame of symbol estimates;

a plurality of map buffers for receiving a corresponding section of the frame symbol estimates from the section buffers and outputting the received section; and a plurality of map engines for receiving a corresponding section of the frame symbol estimates from the map buffers and decoding the received section, wherein each of the map engines generates an initialization state by decoding a last portion of the received section and provides the initialization state to an adjacent map engine, and the adjacent map engine initializes using the received initialization state.

7. The MAP decoder of claim 6, wherein each of the map engines includes a forward state metric calculator for calculating forward state metrics and a reverse state metric calculator for calculating reverse state metrics.

8. The MAP decoder of claim 7, wherein each of the map engines includes a log likelihood ratio calculator for calculating a log likelihood ratio of the forward and reverse state metrics.

9. The MAP decoder of claim 6, wherein each of the map buffers includes a plurality of window buffers where a first group of window buffers outputs the received section while a second group of window buffers reads in a new section of the frame of symbol estimates from a corresponding section buffer.

10. A circuit for performing MAP decoding comprising:

a frame buffer including a plurality of section buffers for storing a frame of symbol estimates, each of the section buffers storing a different section of the frame of symbol estimates, where each of the sections is formed by dividing the frame of symbol estimates;

a plurality of map engines for receiving a corresponding section of the frame symbol estimates from the section buffers and decoding the received section, wherein each of the map engines generates an initialization state by decoding a last portion of the received section and provides the initialization state to an adjacent map engine, and the adjacent map engine initializes using the received initialization state.

11. The circuit of claim 10, wherein each of the map engines includes a forward state metric calculator for calculating forward state metrics and a reverse state metric calculator for calculating reverse state metric.

12. The circuit of claim 11, wherein each of the map engines includes a metric buffer for storing the forward state metrics.

13. The circuit of claim 12, wherein each of the map engines includes a log likelihood ratio calculator for calculating a log likelihood ratio based on the forward state metrics stored in the metric buffer and the reverse state metrics received from the reverse state metric calculator.

* * * * *